United States Patent
Breese et al.

(10) Patent No.: US 6,869,486 B2
(45) Date of Patent: Mar. 22, 2005

(54) METHODS FOR REMOVING METALLIC CONTAMINATION FROM WAFER CONTAINERS

(75) Inventors: Ronald G. Breese, Kalispell, MT (US); C. James Bryer, Kalispell, MT (US); Eric J. Bergman, Kalispell, MT (US); Dana R. Scranton, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 54 days.

(21) Appl. No.: 10/692,829

(22) Filed: Oct. 23, 2003

(65) Prior Publication Data

US 2004/0079393 A1 Apr. 29, 2004

Related U.S. Application Data

(63) Continuation of application No. 10/224,625, filed on Aug. 20, 2002, now abandoned, which is a continuation-in-part of application No. 10/200,071, filed on Jul. 19, 2002, now abandoned, which is a continuation-in-part of application No. 09/658,395, filed on Sep. 8, 2000.

(51) Int. Cl.$^7$ .............................. B08B 3/08; B08B 3/10; B08B 3/12; B08B 9/093
(52) U.S. Cl. ........................ 134/1; 134/22.1; 134/22.18; 134/22.19; 134/26; 134/33; 134/902
(58) Field of Search ........................... 134/22.1, 22.18, 134/22.19, 26, 30, 33, 902, 1

(56) References Cited

U.S. PATENT DOCUMENTS

| | | |
|---|---|---|
| 4,027,686 A | 6/1977 | Shortes et al. |
| 5,705,089 A | 1/1998 | Sugihara et al. |
| 5,738,128 A | 4/1998 | Thompson et al. |
| 5,863,348 A | 1/1999 | Smith, Jr. et al. |
| 6,413,878 B1 | 7/2002 | Woolsey et al. |
| 6,432,214 B2 | 8/2002 | Bryer et al. |
| 6,703,319 B1 * | 3/2004 | Yates et al. .................. 438/745 |
| 2002/0102852 A1 * | 8/2002 | Verhaverbeke et al. ..... 438/690 |

* cited by examiner

Primary Examiner—Zeinab El-Arini
(74) Attorney, Agent, or Firm—Perkins Coie LLP

(57) ABSTRACT

In a method for cleaning for cleaning metallic ion contamination, and especially copper, from wafer containers, the containers are loaded into a cleaning apparatus. The containers are sprayed with a dilute chelating agent solution. The chelating agent solution removes metallic contamination from the containers. The containers are then rinsed with a rinsing liquid, such as deionized water and a surfactant. The containers are then dried, preferably by applying heat and/or hot air movement.

16 Claims, 5 Drawing Sheets ated with metal residue that may cause contamination. # METHODS FOR REMOVING METALLIC CONTAMINATION FROM WAFER CONTAINERS This Application is a Continuation of U.S. patent application Ser. No. 10/224,625, filed Aug. 20, 2002, and now abandoned, which is a continuation-in-part of U.S. patent application Ser. No. 10/200,071, filed Jul. 19, 2002, now abandoned, which is a continuation-in-part of U.S. patent application Ser. No. 09/658,395, filed Sep. 8, 2000, and now pending. These applications are incorporated herein by reference.

BACKGROUND OF THE INVENTION

The field of the invention is apparatus and methods for cleaning workpiece or wafer containers.

In the semiconductor device manufacturing industry, and related industries, flat media, such as semiconductor wafers, memory media, optical devices and masks, and similar flat media, are stored or transported in containers. The containers help to protect the wafers or similar objects from contamination and/or physical damage, during the manufacturing processes. Various types of containers are used, including open containers, such as cassettes, carriers or trays, as well as closable or sealable containers or boxes, including FOUP, FOSB, SMIF pods or boxes.

These containers are often used to contain and transport metal plated wafers, and especially wafers plated with copper. The metal or copper plated wafers may be loaded and unloaded into and out of a container over one hundred times, before processing of the wafers into semiconductor devices is complete. As a result of contact between the plated wafer and the container surfaces, and via abrasion and vibration, the wafer holding or contacting surfaces within the containers often become contaminated with metal residue or particles. This contamination of the containers is especially problematic with copper contamination, which can be highly disruptive to the wafer manufacturing process.

Accordingly, there is a need for methods and apparatus for removing metallic contamination, and especially copper contamination, from wafer containers.

SUMMARY OF THE INVENTION

In a first aspect, containers to be cleaned of metal contamination are sprayed with a metal removal agent. The metal removal agent is preferably a chelating agent. The containers are then rinsed by spraying the containers with a rinsing liquid, such as DI water. The containers are then optionally dried, preferably by flowing heated air over the containers. These steps may be performed while the containers are held within a spinning rotor, or the containers may be stationary on a fixture or platform during cleaning.

In a second aspect, a chelating agent is mixed with water to form a dilute chelating agent solution, effective for removing metallic ion contamination from the containers. Optionally, other chemicals may also be used to enhance cleaning, including surfactants.

In a third aspect, a dilute solution of chelating agent and water is sprayed onto the containers, and is then collected and disposed of. Alternatively, the used solution is collected, recirculated, filtered and reused.

In a fourth aspect, the containers are irradiated with UV light, to further initiate removal of contamination.

In a fifth aspect, an apparatus for removing metal ion contamination of containers includes a rotor within a chamber. The rotor has positions for holding the containers, and optionally for holding container doors as well. A metallic ion cleaning solution, such as a solution of a chelating agent and water, is provided to spray manifolds which spray the solution onto the containers and/or container doors, while the rotor spins.

In a sixth aspect, the apparatus includes a source of concentrated metal removal or chelating agent. The chelating agent is pumped into a water line, where it is mixed with water to form a dilute solution. The dilute solution is then sprayed onto the containers.

Other objects, features and advantages will appear from the following description. While a various embodiment are shown and described, various changes and substitutions can, of course, be made with departing from the invention. The invention resides as well as in subsystems and steps of the apparatus and methods described.

BRIEF DESCRIPTION OF THE DRAWINGS

In the drawings, wherein the same reference number indicates the same element, in each of the views.

While the drawings show a preferred apparatus having a spinning rotor, the invention also includes apparatus and methods involving applying a metal removal agent onto one or more containers. The containers may be stationary or moving. While spraying of the metal removal agent is generally preferred, the containers may also be immersed in a bath of the metal removal agent.

DETAILED DESCRIPTION OF THE DRAWINGS

Figure 1:
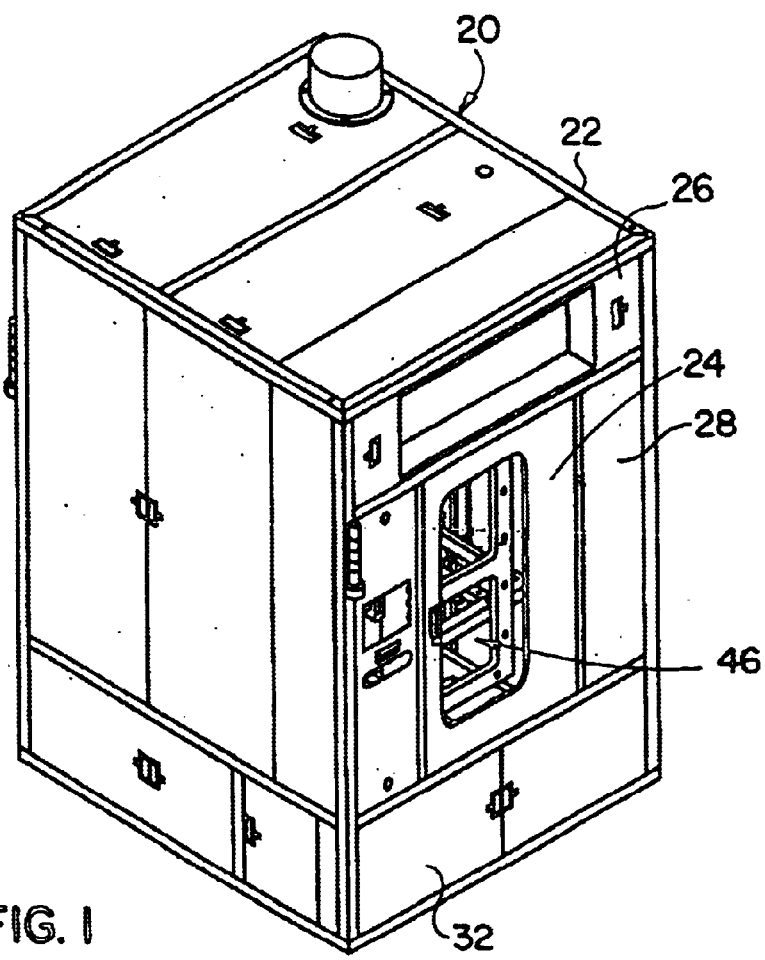
FIG. 1 is a perspective view of one embodiment of an apparatus for use in cleaning or removing metal contamination from containers.
Figure 3:
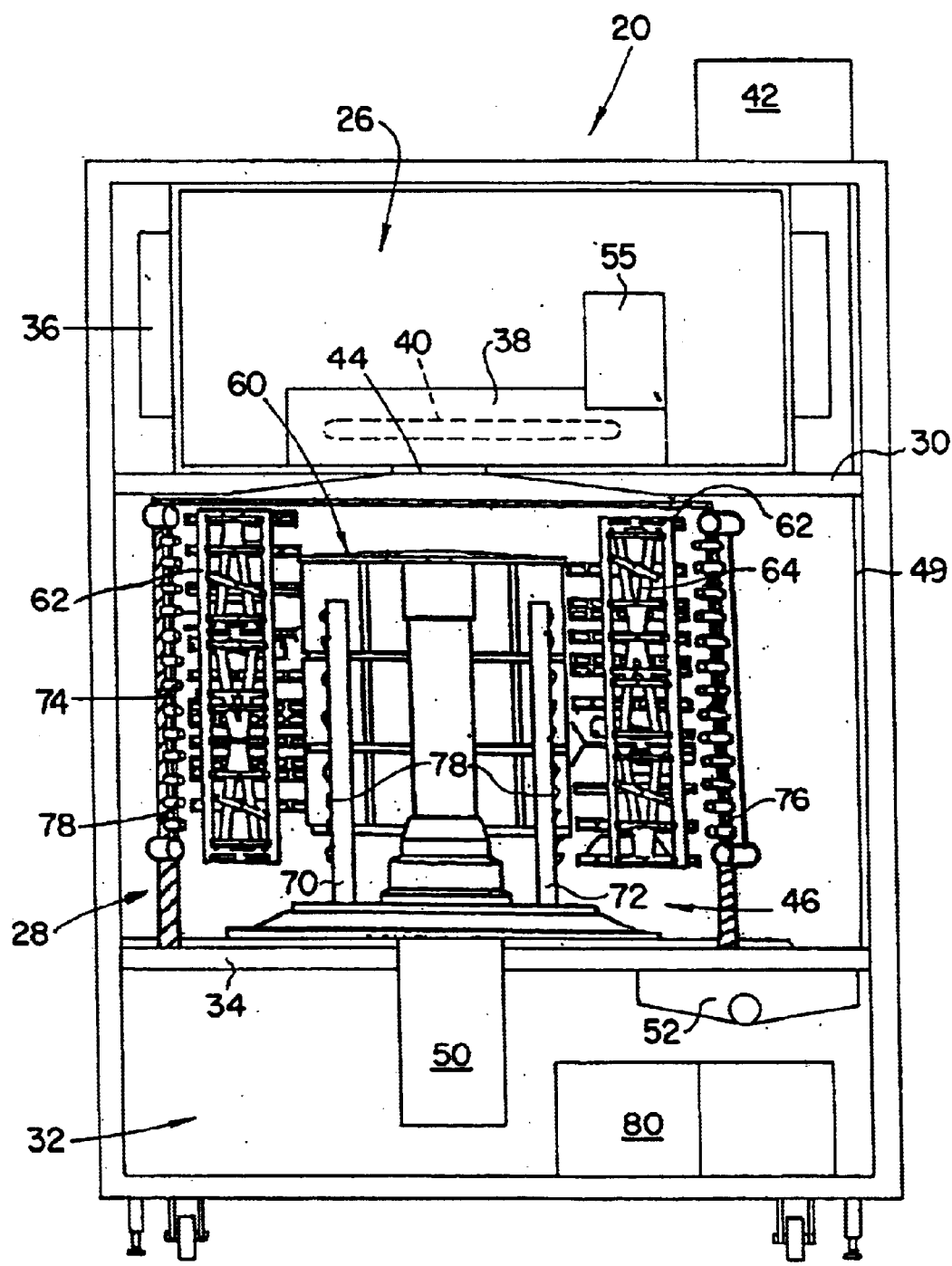
FIG. 3 is a section view of the apparatus shown in FIG. 1.

Turning now in detail to the drawings, as shown in FIG. 1, one preferred apparatus 20 for removing metal contamination from containers, includes an enclosure 22 having a front door 24. Referring now also to FIG. 3, the apparatus 20 has an upper section 26, a central section 28 and a lower section 32. A chamber top wall 30 separates the upper section 26 from the central section 28. A chamber bottom wall 34 separates the central section 28 from the lower section 32.

The upper section 26 includes an air inlet 36 and an air heater 40. The upper section also preferably includes a filter 38 and an anti-static device 55. An air passage 44 extending through the chamber top wall 30 allows filtered heated air to flow into the process chamber 46 formed within the central section 28.

Figure 2:
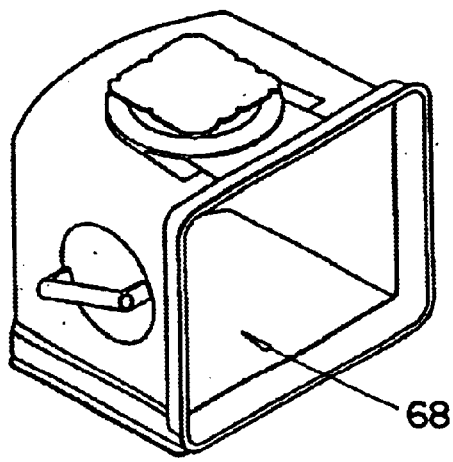
FIG. 2 is a perspective view of a container used for storing and transporting semiconductor wafers and similar flat media devices, with the container door removed.
Figure 4:
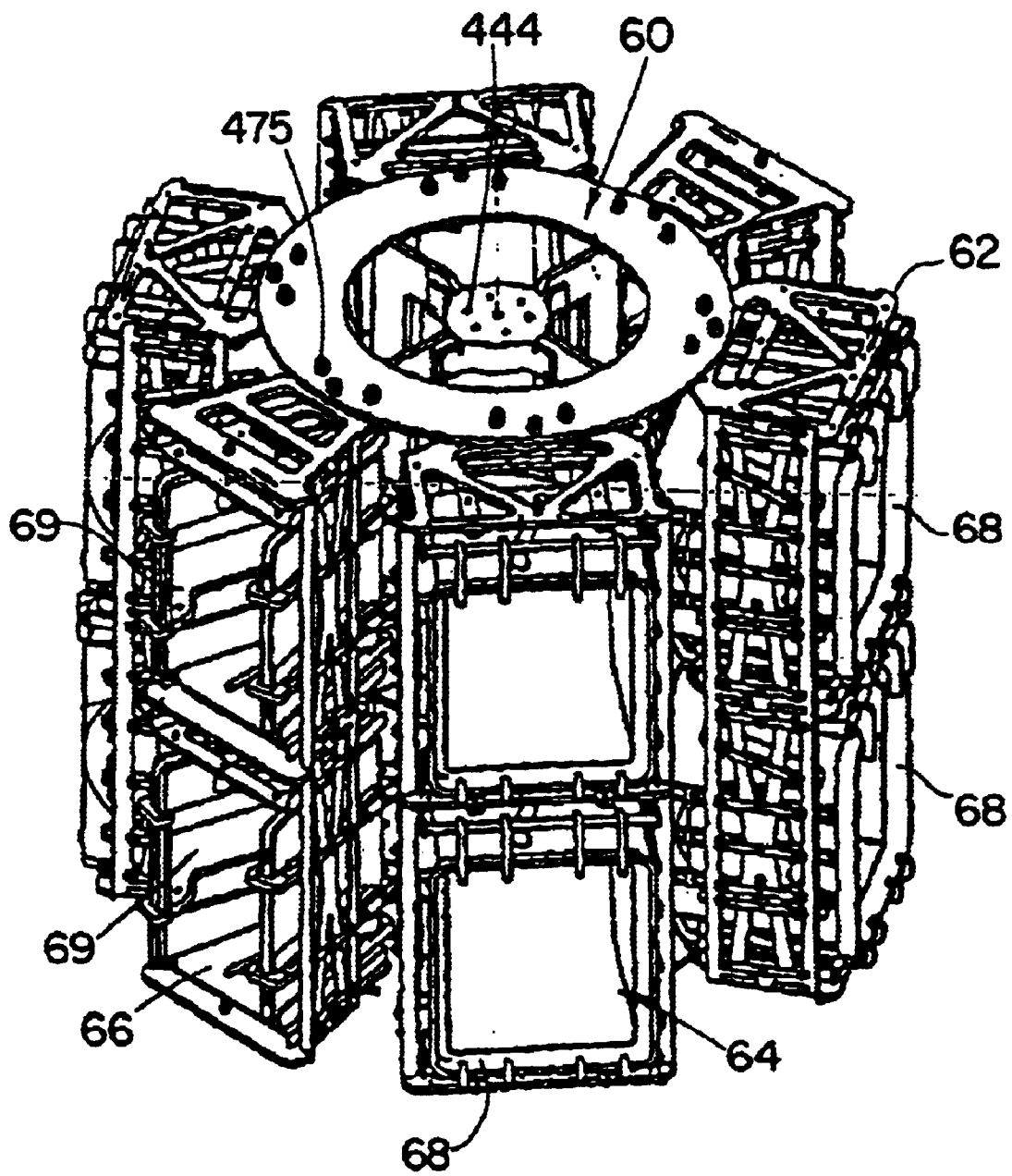
FIG. 4 is a perspective view of the rotor shown in FIG. 2.

A rotor 60 in the central section 28 has frames or ladders 62. The ladders 62 have container holders 64 or door holders 66 or compartments, as shown in FIG. 4. The container holders 64 are adapted to hold containers, such as the container 68 shown in FIG. 2, typically a FOUP, FOSBY, or a SMIF pod. Similarly, the door holders 66 hold the doors 69 of the containers 68.

Figure 5:
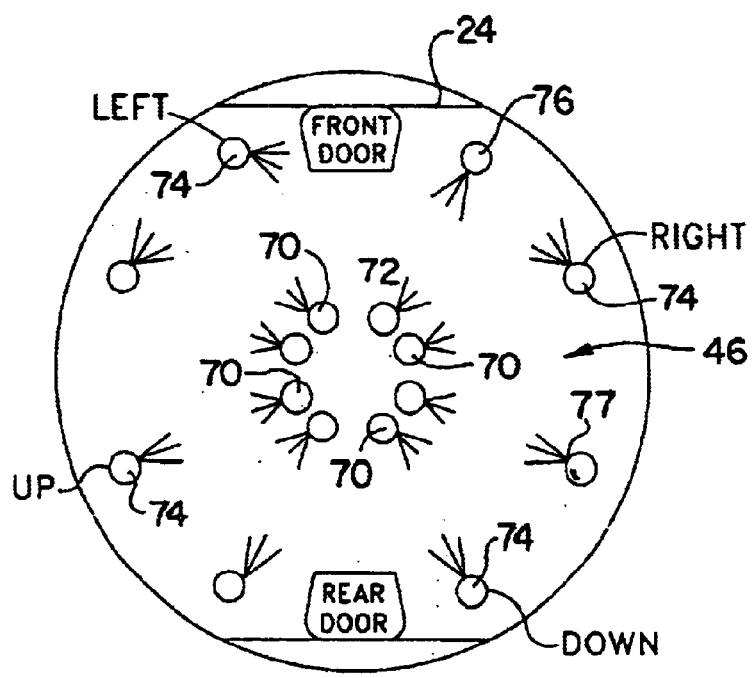
FIG. 5 is a schematic plan view of the chamber shown in FIG. 3, showing the positions and spray angles of the spray manifolds, and omitting other components, for purpose of illustration.
Figure 6:
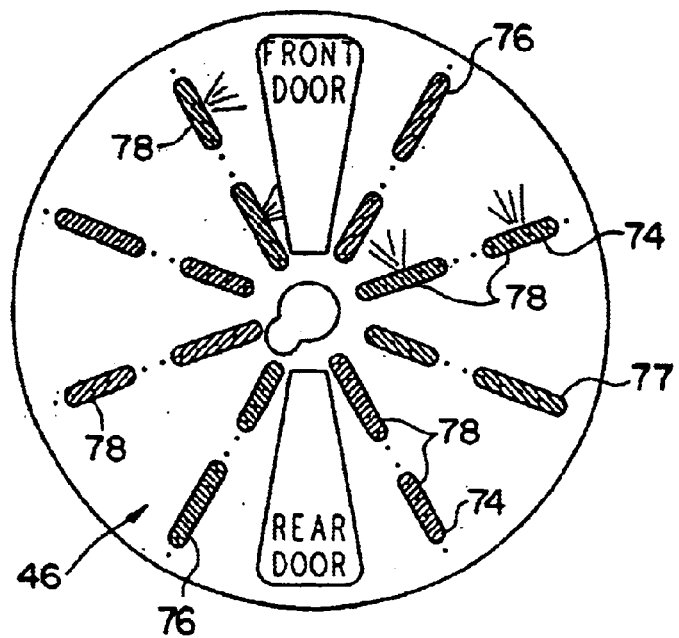
FIG. 6 is a schematic projection or flattened view of the outer spray manifolds shown in FIGS. 3 and 5.

Referring to FIGS. 3, 5 and 6, spray manifolds are positioned within the chamber 46, to spray cleaning, rinsing and/or drying liquids and gases onto the containers and container doors. Outer liquid spray manifolds 74 and outer dry manifolds 76 are generally equally radially spaced apart at or near the outer chamber wall. However, the spacing between outer manifolds adjacent to the front door 24 or rear door (if provided) may be slightly larger. Inner liquid manifolds 70 and inner dry manifolds 72 are similarly generally equally spaced apart, closer to the axis of rotation of the rotor 60. The inner and outer manifolds 70, 72, 74 and 76 are fixed in position and do not rotate with the rotor 60. The ladders 62 including the box and door holders 64 and 66 are suspended or supported from the top of the rotor 60, such that the ladders 62 rotate with the rotor around the outside of the inner manifolds 70 and 72. The liquid spray manifolds 70 and 74 have a series of vertically spaced apart liquid spray nozzles 78. The dry manifolds 72 and 76 similarly have spaced apart gas spray nozzles 77. Four of the outer liquid spray manifold nozzles are directed up, down, left and aright, at an angle $\Theta$ of 30-60, 40-50, or 45 degrees, as shown in FIG. 6.

Referring momentarily once again to FIG. 3, a spin motor 50 in the lower section 32 is connected to the rotor 60, for spinning the rotor. A liquid drain 52 at the bottom of the chamber 46 collects used liquid and removes it from the chamber 46. A liquid and gas supply system 80 is also provided in the lower section 32. Further description of the mechanical design of various of the subsystems of the apparatus 20 is provided in U.S. Pat. Nos. 5,224,503, 6,322,633 and 6,412,502, incorporated herein by reference.

Figure 7:
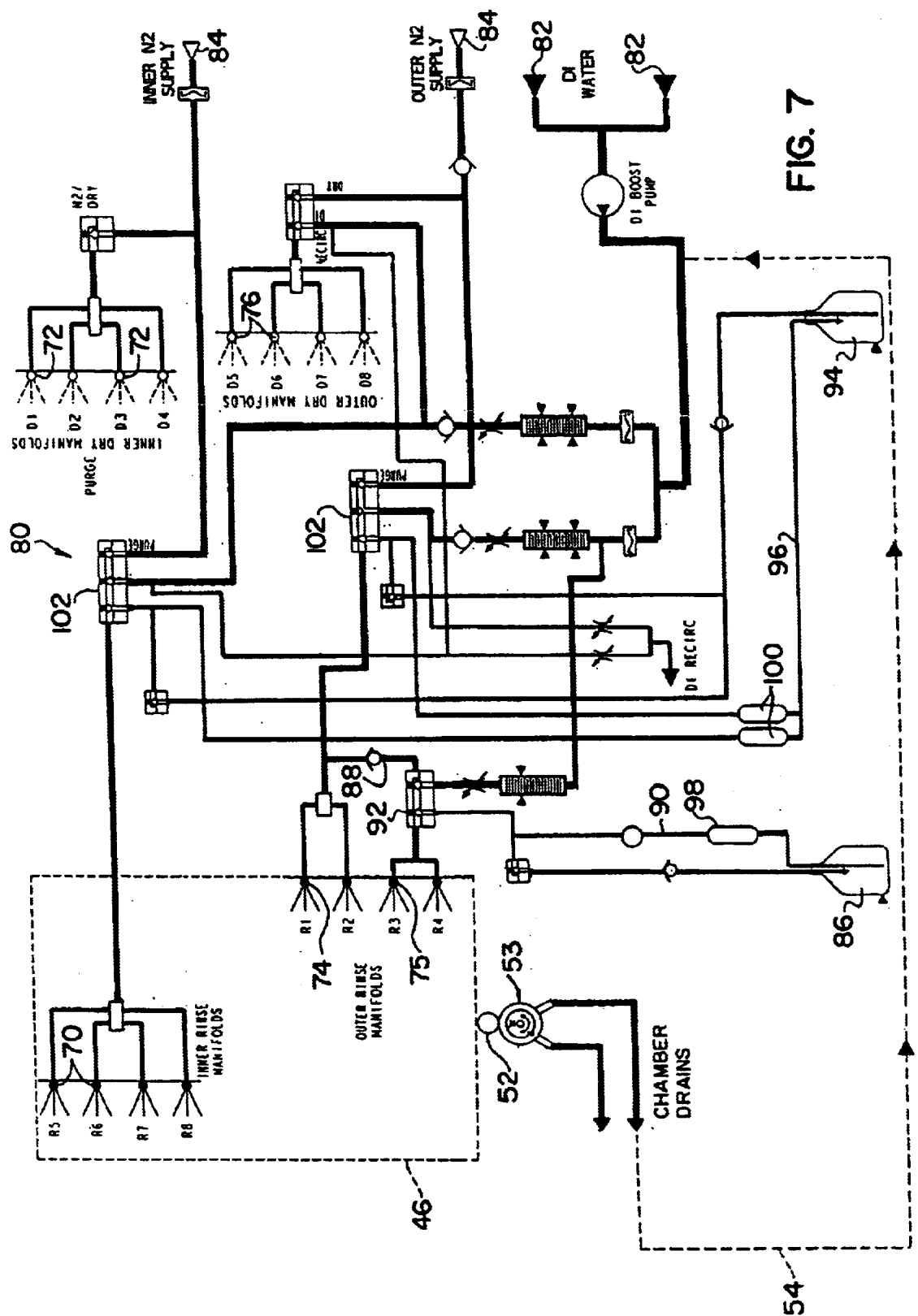
FIG. 7 is a schematic illustration of the liquid and gas supply and delivery systems of the apparatus shown in FIGS. 1 and 3.

Referring to FIG. 7, the liquid and gas supply system 80 includes a DI water supply 82 and a nitrogen gas supply 84, typically provided to the apparatus 20 from separate supplies or sources in the factory or fabrication plant, via pipelines. A metal removal chemical source or bottle 86 contains a metal removal chemical, such as a chelating agent. A supply line 90 runs from the bottle or source 86 through a pump 98 and into a connection valve 92, which is also connected to a DI waterline 88.

In a preferred embodiment, the apparatus 20 also includes a surfactant supply 94 linked via a supply line 96 and pumps 100 to valves 102, which are also linked to DI waterlines. The valve 92 receiving the metal removal chemical, or chelating agent, preferably connects to two of the outer liquid manifolds 75, while the other liquid manifolds are connected to receive DI water and optionally surfactant from the valves 102.

Referring still to FIG. 7, the liquid drain 52 at the bottom of the chamber 46 connects into a divertive drain valve 53. The divertive drain valve 53 is switchable between a first position where used liquids passing through the drain are directed out of the apparatus 20, for collection or other handling or processing. With the divertive drain valve 53 in the second position, used liquids are directed to a recirculation or reclaim line 54, for reuse within the apparatus 20.

In use, the containers 68 and/or doors 69 are loaded into the container holders 64 and door holders 66 in the ladders 62 of the rotor 60, via the front and/or back doors 24 of the apparatus 20. The apparatus doors 24 are closed. The motor 50 is turned on to spin the rotor 60. With the rotor spinning slowly, e.g., 4-30, 6-25 or 10-20 rpm, the containers 68 on the spinning rotor 60 are sprayed with DI water and a dilute solution of the chelating agent, and optionally with a surfactant solution as well. Specifically, the pump 98 pumps the chelating agent from the bottle or source 86 to the valve 92. DI water from the line 88 mixes with the chelating agent to form a dilute solution, typically 10-100, 20-60, 30-50 or 40 parts per million. Alternatively, the bottle 86 may contain a premix solution of chelating agent, surfactant (e.g., 15-S-7 Tergitol) and DI water, (in a ratio of e.g., 16 grams:150 cc:3630 ml), to achieve a 10-100 ppm chelating agent solution.

The dilute chelating agent solution is sprayed out of the outer liquid manifolds 75. The other outer liquid manifolds 74, as well as the inner liquid or rinse manifolds 70 spray DI water during this step, if surfactant is not used. If surfactant is used, the surfactant pumps 100 pump concentrated surfactant from the surfactant source or bottle 94 to each of the two valves 102. The surfactant then mixes with the flowing DI water, forming a dilute surfactant solution, which is sprayed out of the liquid spray nozzles 78 on the inner liquid manifolds 70 and the outer liquid manifolds 74 (i.e., the outer liquid spray manifolds not supplied with the chelating agent). The duration of this metal cleaning or removal step will vary depending on the specific application. The metal removal or chelating solution helps to remove metal contamination from the containers and/or doors.

At the conclusion of the metal removal step, the pump 98 is turned off. The containers 68 are then rinsed with only DI water, or DI water with surfactant. The chamber 46 is then heated by turning on the blanket heaters 49 around the top of the chamber 46, as well as the air heater 40, which heats air flowing down through the air passage 44 into the chamber 46, and exhausting out of the exhaust line 42. The facility or chamber exhaust 42 is preferably flowing at all times. During the rinse step, the rotor continues to spin relatively slowly, e.g., 5-30 rpm. The duration of this rinse step will vary depending on the application. The rinse step is continued by reversing the spin direction of the rotor while continuing to spray rinse liquid and applying heat.

At the conclusion of the rinse steps, the liquid manifolds are purged via the nitrogen supply 84. The drying steps are then commenced by spinning the rotor at a relatively high speed, e.g., 100-500, 200-400, or 300 rpm for a short duration, e.g., one minute, to fling water droplets off of the containers 68. Drying continues by reducing the spin speed to e.g., 150-200 or 175 rpm, for typically about four-six minutes, while continuing to apply heat via the blanket heaters 49 and via heated airflow through the air passage 44. Clean dry air, or nitrogen, is then sprayed out of the dry manifolds, while the rotor is slowly spinning, e.g., at 2-10, 4-8 or 6 rpm. The clean dry air or nitrogen spray dry continues for about one minute. It is then repeated with the rotor slowly turning in the opposite direction. Of course, other parameters of time, spin speed, spin direction, nozzle arrangement, etc. can be used as well. Test results using the methods described above show removal of 75-90% of residual copper.

The chelating agent is preferably 1,2-Diaminocyclohexane-N,N,N$^1$,N$^1$-tetraacetic acid monohydrate, 99%, A.C.S. A high alkaline detergent may be used in place of the surfactant.

Of course, the specific elements and parameters described above relate to only one preferred embodiment. Metallic contamination on containers may also be removed without the apparatus above, by applying the metal removal agent or liquid to one or more containers within various other apparatus. In one alternative embodiment, the apparatus has at least one tank or bath holding a metal removal agent solution, such as the chelating agent solution described above. The container(s) are then immersed into the solution, by hand, or via a robot in the apparatus. The containers may also be rinsed in a rinsing bath or tank, within or separate from the apparatus, with the tank preferably containing DI water.

In another alternative design, one or more containers are held in a fixed or stationary position. The metal removal agent solution is applied or sprayed onto the container, preferably onto both the inside and outside surfaces. Preferably the open side or front of the container is down facing, to allow the solution to drain out. A fixture may hold the container in place, into a position where one or more spray nozzle manifolds extends up into the container, to better spray the solution into the interior of the container. The solution preferably includes a chelating agent as described above.

The container doors may be cleaned in the same manner as the containers, by loading them into door holding positions in the rotor. In the first alternative embodiment, the doors may be immersed for cleaning, in a door holding fixture or elevator, along with the containers. In the second alternative embodiment, the doors may be sprayed with the metal removal agent solution, while the door(s) is stationary, or while the door is rotated in a separate door rotating fixture.

Thus, novel apparatus and methods have been shown and described. Various changes, modifications and substitutions may, of course, be made, within the scope of the invention. The invention, therefore, should not be limited, except to the following claims and their equivalents.

What is claimed:

1. A method for removing a metallic contamination a wafer container of the type used for holding wafers plated with metal, said method comprising the steps of:

spraying inside surfaces of the container with a solution of a liquid including a chelating agent;

rinsing the container; and drying the container.

2. The method of claim 1 further including the step of spraying the inside surfaces of the container via spray nozzles oriented at different angles.

3. The method of claim 1 wherein the concentration of the chelating agent in the solution is 10–100 parts per million.

4. The method of claim 3 wherein the concentration of the chelating agent is 20–60 parts per million.

5. The method of claim 1 wherein the metal comprises copper.

6. The method of claim 1 wherein the solution comprises a chelating agent and de-ionized water.

7. The method of claim 1 further comprising the step of spraying the containers with a surfactant solution.

8. The method of claim 7 wherein the liquid includes the surfactant solution.

9. The method of claim 1 further comprising the step of irradiating the container with UV light to enhance the removal of the metallic contamination.

10. A method for removing a metal from a wafer container having inside and outside surfaces, said method comprising the steps of:

spraying the inside and outside surfaces of the container with a chelating agent solution comprising 1,2-Diaminocyclohexane-N,N,N$^1$,N$^1$-tetraacetic acid monohydrate;

rinsing the container by spraying the inside and outside surfaces of the container with a rinsing solution including water; and drying the container.

11. A method for removing a metal from a wafer container, said method comprising the steps of:

spraying inside surfaces of the container with a cleaning solution consisting essentially of water, a chelating agent, and a detergent or surfactant;

rinsing the container by spraying the inside surfaces with a rinsing solution including water; and drying the container.

12. The method of claim 11 further including the step of spraying outside surfaces of the container with the cleaning solution and with the rinsing solution, via a plurality of spray nozzles oriented at different spray angles.

13. A method for removing a metallic contamination a wafer container of the type used for holding wafers plated with metal, said method comprising the steps of:

loading the container into a rotor;

spinning the rotor at a first speed;

spraying surfaces of the container spinning on the rotor with a solution of a liquid including a chelating agent;

rinsing the container; and drying the container.

14. The method of claim 13 further comprising the step of spinning the rotor at a second speed that is faster than the first speed during the drying step.

15. The method of claim 13 wherein the concentration of the chelating agent in the solution is 20–60 parts per million.

16. A method for removing a metallic contamination from a wafer container of the type used for holding wafers plated with metal, said method comprising the steps of:

holding the container in a stationary position on a fixture;

spraying surfaces of the container with a solution of a liquid including a chelating agent;

rinsing the container; and drying the container.

* * * * *